US009189576B2

(12) United States Patent
Kim et al.

(10) Patent No.: US 9,189,576 B2
(45) Date of Patent: Nov. 17, 2015

(54) ANALYZING SAND STABILIZATION TREATMENTS (71) Applicant: Halliburton Energy Services, Inc., Houston, TX (US)

(72) Inventors: Sung Hyun Kim, Houston, TX (US); Harvey Joseph Fitzpatrick, Jr., Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 454 days.

(21) Appl. No.: 13/800,957

(22) Filed: Mar. 13, 2013

(65) Prior Publication Data
US 2014/0278315 A1    Sep. 18, 2014

(51) Int. Cl.
G06G 7/48 (2006.01)
G06F 17/50 (2006.01)
E21B 43/00 (2006.01)
G01V 3/18 (2006.01)
E21B 43/12 (2006.01)

(52) U.S. Cl.
CPC .......... G06F 17/5009 (2013.01); E21B 43/00 (2013.01); E21B 43/12 (2013.01); G01V 3/18 (2013.01); G06F 17/50 (2013.01)

(58) Field of Classification Search
CPC .......... G01V 3/18; E21B 43/00; E21B 43/12; E21B 47/00; G06F 17/10; G06F 17/50; G06F 17/5009; G06G 7/48
See application file for complete search history.

(56) References Cited

U.S. PATENT DOCUMENTS

| 5,199,492 | A | 4/1993 | Surles et al. |
| 5,211,250 | A | 5/1993 | Kubena, Jr. et al. |
| 7,673,686 | B2 | 3/2010 | Nguyen et al. |
| 7,676,353 | B2 | 3/2010 | Bradford et al. |
| 8,005,658 | B2 | 8/2011 | Tilke et al. |
| 8,165,816 | B2 * | 4/2012 | Searles et al. ............... 702/13 |
| 8,249,844 | B2 * | 8/2012 | Dale et al. ............... 703/10 |
| 8,301,425 | B2 * | 10/2012 | Dale et al. ............... 703/10 |
| 2003/0192691 | A1 | 10/2003 | Vinegar et al. |
| 2004/0213905 | A1 | 10/2004 | Breen et al. |
| 2005/0274516 | A1 | 12/2005 | Nelson et al. |
| 2011/0061860 | A1 * | 3/2011 | Dean et al. ............... 166/250.01 |
| 2012/0043082 | A1 | 2/2012 | Nguyen et al. |
| 2012/0205107 | A1 | 8/2012 | Rickman et al. |
| 2013/0030782 | A1 | 1/2013 | Yogeswaren |

(Continued)

OTHER PUBLICATIONS

Wang et al., "A Coupled Reservoir-Geomechanics Model and Applications to Wellbore Stability and Sand Prediction", SPE 69718, Mar. 2001.*

(Continued)

Primary Examiner — Kandasamy Thangavelu
(74) Attorney, Agent, or Firm — Holly Soehnge; Fish & Richardson P.C.

(57) ABSTRACT

In some aspects, sand stabilization treatments are analyzed. A computing system can determine a first predicted resource production output for a subterranean reservoir based on a sand stability model analysis for a native condition of the subterranean reservoir. The computing system can determine a second predicted resource production output for the subterranean reservoir based on a sand stability model analysis for a stabilization-treated condition of the subterranean reservoir. The computing system can output an economic value comparison of resource production for the native condition and the stabilization-treated condition based on the first and second predicted resource production outputs.

25 Claims, 4 Drawing Sheets (56) References Cited

U.S. PATENT DOCUMENTS

2013/0048280 A1 2/2013 Techentien et al.
2013/0185113 A1 7/2013 Culp et al.

OTHER PUBLICATIONS

Chalaturnyk et al.., "The Mechanisms of Solids Production in Unconsolidated Heavy Oil Reservoirs", SPE 23780, Feb. 1992.*
Wang et al., "An integrated modular approach to modeling sand production and cavity growth with emphasis on the multiphase flow and 3D effects", ARMA/USRMS 08-906, Jun. 2006.*
Wang et al., "Coupled Reservoir-Geomechanics Model With Sand Erosion for Sand Rate and Enhanced Production Prediction", SPE73738, Feb. 2002.*
Napalowski et al., "Successful Implementation of Horizontal Openhole Grovel Pocking in the Styborrow Field, Offshore Western Australia", SPE 116434, Oct. 2008.*
Brito-Rohr et al., "Efficient Alternative to Control Sand Production in Wells with Oil/Water Contact at the Wellbore", SPE 86536, Feb. 2004.*
Wang, Y., "Sand Production and Foamy Oil Flow in Heavy-Oil ReseNoirs", SPE 37553, Feb. 1997.*
Zhang et al., "Optimized Perforation Tunnel Geometry, Density and Orientation to Control Sand Production", SPE 107785, Jun. 2007.*
Samsuri et al., "Minimize sand production by controlling wellbore geometry and flow rate", SPE 64759, Nov. 2000.*
Authorized Officer Chan Yoon Hwang, PCT International Search Report and Written Opinion of the International Searching Authority, PCT/US2014/019107, Jun. 13, 2014, 17 pages.

* cited by examiner

ANALYZING SAND STABILIZATION TREATMENTS

BACKGROUND

This specification relates to analyzing sand stabilization treatments. Sand stabilization treatments are often used to improve mechanical stability in subterranean reservoirs. Such treatments can be applied near a wellbore, for example, using cementing materials, polymer gels, or other materials that tend to reduce sand mobility near the wellbore. Sand stabilization treatments can increase the mechanical stability of the sand, and decrease the inflow of sand during production.

SUMMARY

In a general aspect, a modeling system compares production under sand-stabilization-treated conditions.

In some aspects, a computing system determines a first predicted resource production output for a subterranean reservoir based on a sand stability model analysis for a native condition of the subterranean reservoir. The computer system determines a second predicted resource production output for the subterranean reservoir based on a second stability model analysis for a stabilization-treated condition of the subterranean reservoir. The computing system generates an economic value comparison of resource production for the native condition and resource production for the stabilization-treated condition based on the first and second predicted resource production outputs.

Implementations may include one or more of the following features. The economic value comparison includes information on a net present value of resource production for the native condition, and information on a net present value of resource production for the stabilization treated condition. The economic value comparison includes calculating the net present value of resource production for the native condition based on a cost of completion under the native condition and a time value of resource production under the native condition. The economic value comparison includes calculating the net present value of resource production for the stabilization-treated condition based on a cost of completion under the stabilization-treated condition and a time value of resource production under the stabilization-treated condition.

Additionally or alternatively, these and other implementations may include one or more of the following features. The computing system analyzes sensitivity of the economic value comparison to variations in input parameters used to determine the first predicted resource production output and the second predicted resource production output. A resource production plan is selected for the subterranean reservoir based on the economic value comparison. The selected resource production plan includes production of reservoir resources under the native condition or production of reservoir resources under the stabilization-treated condition. The resource production plan is initiated after its selection.

Additionally or alternatively, these and other implementations may include one or more of the following features. The first predicted resource production output is determined based on determining a duration of wellbore productivity for the native condition based on the sand stability model analysis for the native condition, and a resource production rate for the native condition over the duration of wellbore productivity for the native condition. The second predicted resource production output is determined based on determining a duration of wellbore productivity for the stabilization-treated condition based on the sand stability model analysis for the stabilization-treated condition and a resource production rate for the stabilization-treated condition over the duration of wellbore productivity for the stabilization-treated condition.

Additionally or alternatively, these and other implementations may include one or more of the following features. The duration of the well bore productivity for the native condition is determined based on a predicted sand stability failure under the native condition. And the resource production rate for the native condition is determined based on a nodal analysis flow simulation for the native condition. The duration of well bore productivity for the stabilization-treated condition is determined based on a predicted sand stability failure under the stabilization-treated condition. And the resource production rate for the stabilization-treated condition is determined based on a nodal analysis flow simulation for the stabilization-treated condition. The nodal analysis flow simulation for the native condition accounts for variations in reservoir pressure over time under the native condition. And the nodal analysis flow simulation for the stabilization-treated condition accounts for variations in reservoir pressure over time under the stabilization-treated condition.

Additionally or alternatively, these and other implementations may include one or more of the following features. The first predicted resource production output is based on a sand stability model analysis for the native condition of the subterranean reservoir with a mechanical sand control scheme. The mechanical sand control scheme includes gravel packs, fracture packs, sand screens, or a combination them.

The details of one or more implementations are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

A reservoir can be treated with sand consolidation or other sand control methods to improve stability. A well having a greater stability may have a longer production life and a greater net production value. Though in some instances, the sand consolidation treatment may not create enough improvement to justify the cost associated with the treatment. For example, a natural well may be stable in the natural condition without additional consolidation treatment; and a consolidation treatment may not create extra value profitable over the cost. A net production value is at least one of the factors indicative of benefits of treating a natural well with sand consolidation or other improvement methods. Alternative reservoir formation conditions in a same reservoir can yield different net production values.

A well of improved stability may have a longer production life prior to failure, a higher production rate, and a greater net production value (NPV). Sand consolidation value analysis can include comparing sand stability models, simulating reservoir production or injection, calculating consolidation service cost, calculating NPV for alternative treatment schemes, or any combination of these and other analyses. Sand consolidation value analysis may use measured data or parameters to improve accuracy of various models implemented within. Sand consolidation value analysis can determine a resource production output for a subterranean reservoir based on a sand stability model analysis for a native condition, and a resource production output for the same subterranean reservoir for a stabilization-treated condition, and compare the two production outputs for an economic analysis.

In some cases, the lifetime value of a sand stabilization treatment is analyzed in an integrated modeling system that simulates the completion, treatment, and production lifetime of the well system. For example, the lifetime value of a sand stabilization treatment can be analyzed in comparison to the lifetime vale of an untreated reservoir condition, in comparison to a different type of sand stabilization treatment, etc. In some instances, the integrated modeling system performs a comprehensive simulation of various reservoir conditions and provides an overall economic value comparison of the reservoir conditions as an output. The simulations can account for the costs of treatment, the costs of production, the duration and volume of resource production, and other factors.

Figure 1:
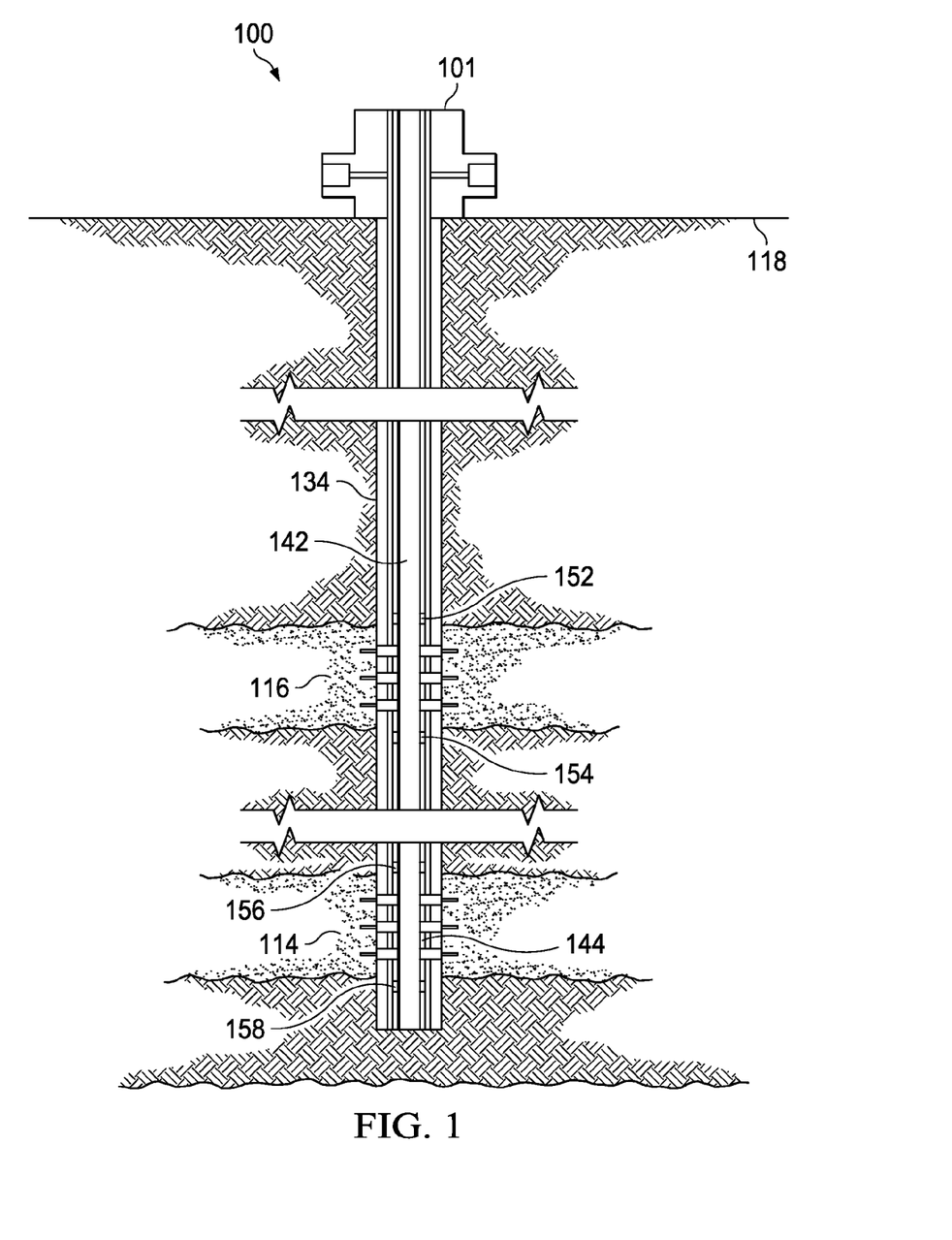
FIG. 1 is a schematic diagram of an example well system.

FIG. 1 is a schematic view of an example well system 100. The well system 100 includes a wellhead 101 installed above the ground surface 118. From the wellhead 101, a wellbore 134 extends through the various earth strata, including formations 114 and 116. A work string 142 resides in the wellbore 134. The work string 142 may include various tools, such as a sand control screen, which can be positioned, for example, within a production interval 144 between packers 156 and 158, and adjacent to the formation 114, or between packers 152 and 154, adjacent to the formation 116. The work string 142 may include additional features and equipment, such as, for example, various sensors (not shown) for measuring and monitoring operations. For example, the sensors may send measurement data to a computer system in communication with the well system 100, to a control module at the well system 100, etc.

In some instances, a sand consolidation treatment, or another type of stabilization treatment, can be applied to one or both of the formations 114, 116 through the wellbore 134. For example, after the work string 142 is inserted in place, a treatment fluid containing cement, gel, sand, gravel, proppants or the like can be pumped down work string 142 to treat the formations 114 and 116. In some instances, such treatments can reduce mobility of the sand and increase the mechanical stability of the treated formation. Sand stabilization treatments can be applied using other techniques, including other types of fluids, other types of completions and other types of well systems. Moreover, sand stabilization treatments can be applied for other purposes, and may have other effects on the treated formation or other nearby formations. The techniques and systems described here can be applied in subterranean regions that include one or more rock formations, or part of a rock formation. The example wellbore 134 shown in FIG. 1 is a vertical well in a land surface operation. The techniques and systems described here can be used in other types of systems, including wellbores having other directional orientations such as deviated wells, inclined wells, horizontal wells, wells in offshore operations, etc.

Some of the techniques and operations described herein may be implemented by a computing subsystem configured to provide the functionality described. In various embodiments, a computing system may include one or more of various types of devices, including, but not limited to, personal computer systems, desktop computers, laptops, notebooks, mainframe computer systems, handheld computers, workstations, tablets, application servers, storage devices, or any type of computing or electronic device.

Figure 2:
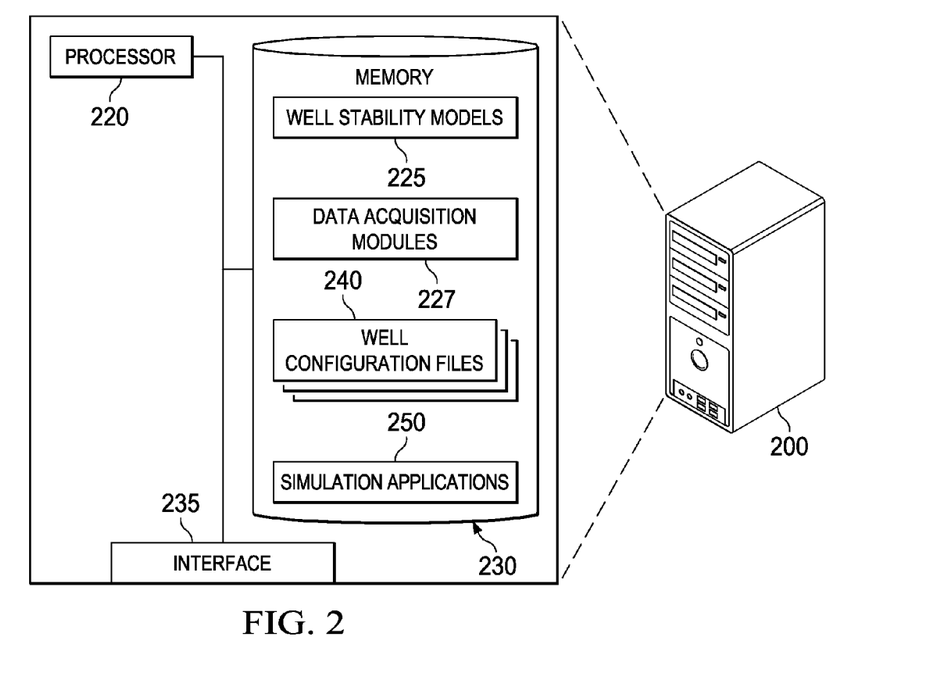
FIG. 2 is a schematic diagram of an example computer system for analyzing sand stabilization treatments.

FIG. 2 is a schematic diagram of an example computer system 200 that can be used to analyze sand stabilization treatments. For example, the example computer system 200 can be used for analyzing the economic value of alternative reservoir formation conditions, which may include native conditions, various types of stabilization-treated conditions, and other types of conditions. The example computer system 200 can be a part of a well system (e.g., the well system 100 shown in FIG. 1), or the example computer system 200 can be part of a separate facility or system that is not directly associated with any particular well system.

In some implementations, the computer system 200 can analyze net production values (NVP) and other economic factors for various reservoir formation conditions. For example, the computer system 200 can model a well and simulate its treatment and production using measured or predicted parameters. Different parameters can be used to model different reservoir formation conditions, which may generate different NVP results. For example, the computer system 200 can simulate well production and predict production life, production rate, and economic values associated with the well in different conditions for finding an economically advantageous plan. The different conditions can be realized by using different treatment methods, such as sand consolidation treatments, fracture treatments, etc. Different conditions can be simulated using various data and models that reflect the physical effects or phenomena associated with different treatment processes, various natural conditions, etc.

The example computer system 200 can be located at or near a well system, or the example computer system 200 may operate independent of a well system. The example computer system 200 shown in FIG. 2 includes an interface 235, a processor 220, and a memory 230. A computing system can include additional or different components and features. The computer system 200 can be preprogrammed or it can be programmed (and reprogrammed) by loading a program from another source (e.g., from a disk, from another computer device through a data network, or in another manner). In some implementations, one or more input/output devices can be coupled to the interface 235. The input/output devices can include, for example, a monitor, a mouse, a keyboard, or other input/output devices. The input/output devices may receive and transmit data in analog or digital form over communication links such as a serial link, a wireless link (e.g., infrared, radio frequency, or others), a parallel link, or another type of link.

The memory 230 can store instructions (e.g., computer code) associated with an operating system, computer applications, and other resources. The memory 230 can also store application data and data objects that can be interpreted by one or more applications or virtual machines running on the computer system 200. The memory 230 can include, for example, a random access memory (RAM), a storage device (e.g., a writable read-only memory (ROM) or others), a hard disk, or another type of storage medium. As shown in FIG. 2, the example memory 230 includes well stability models 225, data acquisition modules 227, well configuration files 240, and simulation applications 250. In some implementations, a memory of a computing device includes additional or different information.

The well stability models 225 can include model data for sand stability analysis. For example, the well stability models 225 can include models for analyzing sand stability failure criteria of a target well. The calculation may be based on layer properties of the reservoir, in-situ data measured from the formation, and a range of input parameters, such as completion data, flow parameters, etc. The well stability models 225 can receive data or parameters from other data and data objects in the memory 230, such as the, data acquisition modules 227, the well configuration files 240, etc.

The data acquisition modules 227 can include data and applications for obtaining information associated with the target well. For example, the data acquisition modules 227 can obtain information collected from various sensors installed on a well tool, logging data, historical data, outcrop data, etc. The information can be stored in a database associated with the data acquisition modules 227. In some implementations, the data acquisition modules 227 use data from analog wells for analog field for sand stability analysis or simulation.

The well configuration files 240 can include information associated with configuration parameters of different well conditions. The well configuration files 240 may identify the geometries, locations, depths, shapes, formation parameters, and other properties of well configuration. The well configuration files 225 can include data types on structural, thermal, chemical, and other qualities to describe the configuration of a well. For each well configuration file, the configuration data may include native formation layer properties, in situ data of native formation properties, input parameter values, and other well configuration information.

The simulation applications 250 can include simulation applications, scripts, programs, functions, executables, or other modules that are interpreted or executed by the processor 220. Such applications may include machine-readable instructions for performing one or more of the operations associated with the sand stabilization analysis described below. For example, the simulation applications 250 can perform a nodal analysis flow simulation and other types of simulations. Multiple simulators may be packaged or integrated into the simulation applications 250 to operate under a unified graphical user interface (GUI). The simulation applications 250 may further interface with the well configuration files 240 and well stability models 225 to facilitate data loading and input/output selection.

Examples of simulation applications include various types of sand stability analysis modules, reservoir simulator modules, resource production prediction modules, economic value analysis modules, production lifetime estimators, nodal analysis modules, and others. Some or all of these and other types of simulation applications can be integrated in an overall simulation system architecture, or the application can be made to interface in another manner within a computing system. For example, a simulation manager infrastructure can acquire input data from various data sources, invoke the appropriate simulation applications, and provide inputs and outputs between the simulation applications in a logical manner. In some instances, the simulation manager infrastructure can systematically iterate or modify simulation applications to model specified input conditions, reservoir conditions, or other factors.

Figure 3:
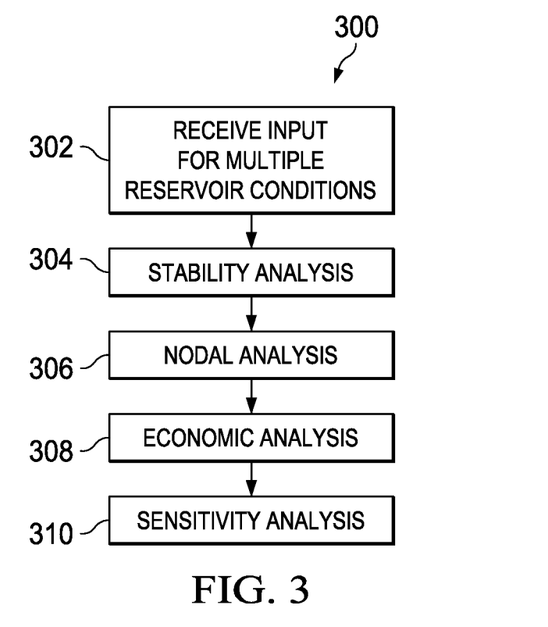
FIG. 3 is a flow chart showing an example process for analyzing sand stabilization treatments.

The processor 220 can execute instructions, for example, to generate output data based on data inputs. For example, the processor 220 can run the well stability models 225, the data acquisition modules 227, the well configuration files 240, or the simulation applications 250 by executing or interpreting the software, scripts, programs, functions, executables, or other modules contained in the memory 230. The processor 220 may perform one or more of the operations associated with the simulation system as illustrated in FIG. 3. The input data received by the processor 220 or the output data generated by the processor 220 can include data stored in the memory 230, data displayed in a GUI, data transmitted over a network or communication link, or other information.

FIG. 3 is a flow chart showing an example process 300 for analyzing sand stabilization treatments. The example process 300 can be used, for example, to find relationships among input parameters and production output and the related economic values. The example process 300 can be performed in a computer system, such as, for example, the computer system 200 shown in FIG. 2 or another type of computer system. The example process 300 can be used to model various attributes and events associated with a well system such as, for example, the example well system 100 shown in FIG. 1 or another type of well system. The example process 300 can be used to model a single-well system, a multi-well system, a well system including multiple interconnected wellbores, or another type of well system. The process 300, individual operations of the process 300, or groups of operations may be iterated or performed simultaneously to achieve a desired result. In some cases, the process 300 may include the same, additional, fewer, or different operations performed in the same or a different order.

At 302, input for multiple reservoir conditions is obtained. The input can be used for setting up reservoir models for subsequent simulations and analyses. The input can include various data types that identify conditions of the reservoir, well geometries, well configuration, well treatment schemes, etc. For example, the input can include in situ native formation properties from direct sources, simulations, or physical measurements, and sand consolidation treated formation layer properties from direct sources, simulations, or physical measurements.

At 304, the computer system performs a sand stability analysis. The sand stability analysis can determine a duration of wellbore productivity. For example, the duration of wellbore productivity for a subterranean reservoir for native condition can be determined by predicting, based on the input parameters related to reservoir formation properties and production, when a sand stability failure would occur. The duration of wellbore productivity for a stabilization-treated condition can also be determined based on the sand stability model analysis that predicts a sand stability failure under the stabilization-treated condition. The duration of well bore productivity for the native condition can be determined based on a predicted sand stability failure under the native condition. For example, the sand stability analysis can determine conditions of sanding onset and volume of sand produced into the wellbore versus production or injection operation parameters to predict sand stability failure. In some implementations, the sand stability model analysis for native conditions can include a mechanical sand control scheme. The mechanical sand control scheme can include a gravel pack, a fracture pack, sand screens, etc.

At 306, the computer system performs a nodal analysis. The nodal analysis can be a flow simulation that simulates resource production under conditions defined with the input parameters. The nodal analysis flow simulation can account for variations in reservoir pressure over time under the native condition as well as under the stabilization-treated condition. The nodal analysis can determine a resource production rate for the native condition and the stabilization-treated condition. The resource production rate determined by the nodal analysis can be used with the production duration determined by the stability analysis at 304 to predict the total production amount (e.g., to determine a net present value) for the economic analysis at 308.

At 308, the computer system performs an economic analysis. The economic analysis can include calculating a net present value of resource production for the native condition based on a cost of completion under the native condition and a time value of resource production under the native condition. The net present value for the stabilization-treated condition can be calculated based on a cost of completion under the stabilization-treated condition and a time value of resource production under the stabilization-treated condition. The information on the net present value of resource production for the native condition can then be compared with the net present value of resource production for the stabilization-treated condition to obtain an economic comparison. In some instances, (e.g., when the net present value for the stabilization-treated condition is higher than the net present value for the native condition) the economic value comparison may indicate that the sand stabilization treatment with the corresponding input parameters would be economically beneficial.

At 310, the computer system performs a sensitivity analysis. The sensitivity analysis can analyze the sensitivity of the economic value comparison to variations in input parameters used to determine the predicted resource production outputs for the native condition and the stabilization-treated condition. In some implementations, the stability analysis includes varying input parameters to find an improved (e.g., beneficial, optimized, etc.) economic value. For example, based on the sensitivity analysis, the input parameters can be varied (e.g., by using an iterative algorithm) to find a maximum predicted resource production output for the stabilization-treated condition subterranean reservoir to identify a beneficial condition for the sand stabilization treatment.

Figure 4:
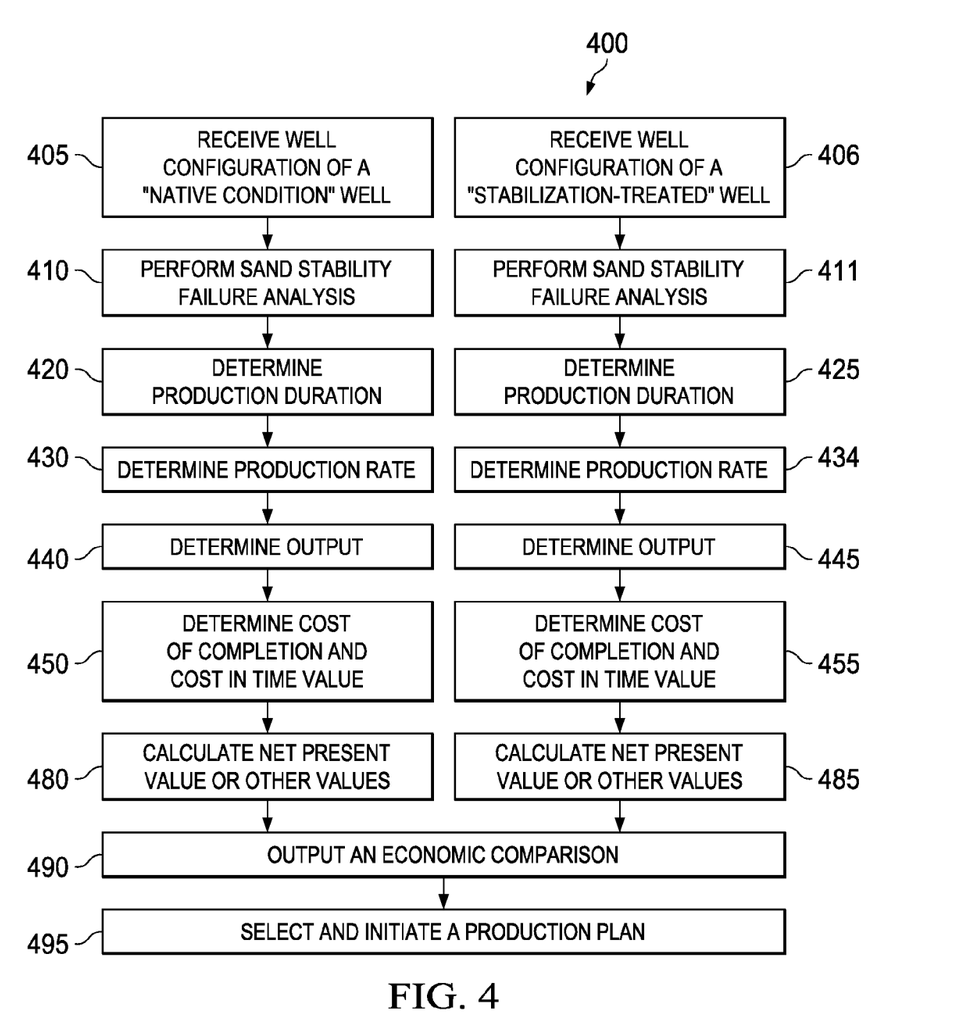
FIG. 4 is another flow chart showing an example process for analyzing sand stabilization treatments.

FIG. 4 is a flow chart showing another example process 400 for analyzing sand stabilization treatments. In some cases, one or more of the example operations shown in FIG. 4 can be used to implemented operations shown in FIG. 3, or the operations shown in FIG. 4 can be used in other contexts. The example process 400 can be performed in a computer system, such as, for example, the computer system 200 shown in FIG. 2 or another type of computer system. The example process 400 can be used to model various attributes and events associated with a well system such as, for example, the example well system 100 shown in FIG. 1 or another type of well system. The example process 400 can be used to model a single-well system, a multi-well system, a well system including multiple interconnected wellbores, or another type of well system. The process 400, individual operations of the process 400, or groups of operations may be iterated or performed simultaneously to achieve a desired result. In some cases, the process 400 may include the same, additional, fewer, or different operations performed in the same or a different order.

FIG. 4 shows two columns of operations: one (on the left) for a native condition reservoir, the other (on the right) for the reservoir treated with sand stabilization. The operations shown can be used to compare the reservoir under native conditions with the same or a different reservoir under sand-stabilization treated conditions. With reference to the left column, the term "native condition" is used broadly to refer any one or more of many possible conditions that are different from the sand-stabilization treated condition. For example, the reservoir modeled in the native condition may include one or more wellbores, completion equipment installed in the wellbore or at the surface, including production equipment, treating equipment, sand control tools, and other hardware. The native condition may include some or all of the reservoir in a treated or untreated condition. For example, the reservoir in the native condition may have been treated by a fracture treatment, a heated fluid treatment, or another type of treatment. The sand-stabilization treated condition can represent any one or more of many possible conditions of the reservoir after one or more sand consolidation treatments or other types of structural stabilization treatments. For example, the sand-stabilization treated condition can represent the condition of all or part of a reservoir after the application of cementing materials, polymer gels, or other materials that tend to reduce sand mobility (e.g., near a wellbore, in other parts of the reservoir, etc.).

The operations in each column in FIG. 4 can be performed in parallel, in sequence, or in another manner. The operations in each column can operate on common input data, such as, for example, reservoir data, resource value data, and other types of information. In some instances, the process 400 can be used to determine sand stability for both in situ native reservoir formation and for consolidation treated formation. The process 400 can be adapted for other types of analysis, such as, for example, to compare two different types of sand stabilization treatments. Treatment for sand stability can be improved or optimized based on simulations performed on sand stability models with different well and completion configurations. Production duration and production rate can be determined using sand stability models and nodal flow analysis. The net present value (NPV) of resources and other economic factors can be analyzed from the parameters generated by the models. The parameters can also be varied for multiple iterations, for example, to test sensitivity or to improve economic output.

As shown in the left column in FIG. 4, at 405, configuration data of a native condition well of a subterranean reservoir is received. The configuration data can be in situ native formation layer properties data from direct record sources, simulations, physical measurements, or other sources. The configuration data can include additional information on native formation properties for sand stability analysis. A potential range of input parameter values can be determined based on general well operation procedures. For example, the configuration data and input parameter values can include the geometries, locations, depths, shapes, formation parameters, and other properties of well configuration. The configuration data may also include structural data, thermal data, chemical data, and other qualities that represent the well configuration. In some implementations, a closed-loop procedure may be used to iterate and determine the input parameter values used at 405.

At 410, sand stability failure analysis is performed for the native condition reservoir under well operation conditions. The sand stability failure analysis can determine conditions of a sanding onset and volume of sand produced into the wellbore in terms of production or injection operations parameters. The sand stability failure analysis can determine a set of failure criteria for sanding initiation and sand volume under operating conditions for native formation properties.

At 420, based on the sand stability failure analysis at 410, a production duration can thus be determined based on the time period between the start of production and the predicted sand stability failure. Flow rate versus failure parameter characteristics can be determined for the simulated formation conditions. At 430, production rate is determined for the native condition reservoir using a nodal analysis well flow simulator. For example, input parameters can be loaded for native in situ conditions to run the reservoir simulator from initial reservoir conditions to reservoir conditions at sand stability and sand volume failure limits using the flow versus failure parameter relationship determined with nodal flow analysis. Native formation production, flow rates, or injection volume as a function of time, from initial conditions to sanding failure conditions, can then be determined with the well flow simulator. The well flow simulator can account for various complex fluid dynamic factors, such as, for example, tubular backflow, variable inflow content (e.g., water, hydrocarbons, etc.), sanding, and other factors. The instantaneous temporal derivative of the production volume can be calculated to determine the production rate.

At 440, the production output can be determined based on the production duration and the production rate. The analyses from steps 405 to 440 may be repeated for each well in a multi-well field development. In some implementations, a field reservoir simulator can be used to model field production results for the native condition reservoir. Production well effects and injection well effects can also be included and modeled in the field reservoir simulator.

At 450, cost of completion and cost in time value are calculated. The cost of completion can be determined based on material, labor, machinery, and other expenditures related to the completion of the well in the native condition reservoir. The cost in time value can be determined based on cost associated with opportunity cost, idling labor, machinery, and other unrealized values in the completion time period. In some instances, for the well in the native condition reservoir, both the cost of completion and cost in time value can be minimal compared to situations involving sand stabilization treatments and other treatments.

At 480, net present value, internal rate of return, and/or other financial performance evaluation of the well in the native condition reservoir are calculated. For example, the net present value may be determined based on the total production value subtracted with the cost of completion and cost in time value. The total production value can be determined based on the production duration and production rate. The financial performance evaluation can summarize the profitability of the well in the analyzed configuration (i.e., in a native condition reservoir).

Analysis similar to that performed from 405 to 480 on the native condition reservoir can be used to analyze the same reservoir for a stabilization-treated condition. For example, at 406, well configuration of the stabilization treated well in the subterranean reservoir is received. The well configuration can be used to perform a sand stability failure analysis at 411. The sand stability failure analysis can be used to determine a production duration at 425. At 434, a nodal analysis well flow simulation can be used to determine the production rate. At 445, total production output can be determined based on the production duration and the production rate. At 455, cost of the stabilization treated completion, cost in time value, and other cost associated with the sand stabilization treatment are determined. At 485, the net present value, internal rate of return, and other financial performance evaluation of the well in the sand stabilization treated condition reservoir are calculated.

At 490, an economic comparison over the net present values, internal rate of return, and other financial performance evaluation of the native condition reservoir and the reservoir of stabilization treated condition is generated. The economic comparison output can indicate how much additional profit is generated with sand stabilization treatment applied to a well. Input parameters may be iterated to find a maximum profit gain. At 495, a production plan based on the input parameters generating a most profit is selected and initiated. For example, the input parameters related to the most profitable simulation can be selected in the corresponding well construction, completion, and treatment operations in actual practice.

Some embodiments of subject matter and operations described in this specification can be implemented in digital electronic circuitry, or in computer software, firmware, or hardware, including the structures disclosed in this specification and their structural equivalents, or in combinations of one or more of them. Some embodiments of subject matter described in this specification can be implemented as one or more computer programs, i.e., one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal; a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A client and server are generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). The relationship of client and server arises by virtue of computer programs running on the respective computers and having a client-server relationship to each other.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

The invention claimed is:

1. A method comprising:
    determining, by a computing system, a first predicted resource production output for a subterranean reservoir based on a sand stability model analysis for a native condition of the subterranean reservoir;
    determining, by the computing system, a second predicted resource production output for the subterranean reservoir based on a sand stability model analysis for a stabilization-treated condition of the subterranean reservoir; and
    outputting an economic value comparison of resource production for the native condition and resource production for the stabilization-treated condition based on the first predicted resource production output and the second predicted resource production output.

2. The method of claim 1, wherein the economic value comparison includes information on a net present value of resource production for the native condition and information on a net present value of resource production for the stabilization-treated condition.

3. The method of claim 2, comprising:
    calculating the net present value of resource production for the native condition based on a cost of completion under the native condition and a time value of resource production under the native condition; and
    calculating the net present value of resource production for the stabilization-treated condition based on a cost of completion under the stabilization-treated condition and a time value of resource production under the stabilization-treated condition.

4. The method of claim 1, comprising analyzing, by the computing system, sensitivity of the economic value comparison to variations in input parameters used to determine the first predicted resource production output and the second predicted resource production output.

5. The method of claim 1, comprising selecting a resource production plan for the subterranean reservoir based on the economic value comparison, wherein the selected resource production plan includes production of reservoir resources under the native condition or production of reservoir resources under the stabilization-treated condition.

6. The method of claim 5, comprising initiating the resource production plan.

7. The method of claim 1, wherein
    determining the first predicted resource production output includes:
        determining a duration of wellbore productivity for the native condition based on the sand stability model analysis for the native condition; and
        determining a resource production rate for the native condition over the duration of wellbore productivity for the native condition; and
    determining the second predicted resource production output includes:
        determining a duration of wellbore productivity for the stabilization-treated condition based on the sand stability model analysis for the stabilization-treated condition; and
        determining a resource production rate for the stabilization-treated condition over the duration of wellbore productivity for the stabilization-treated condition.

8. The method of claim 7, wherein the duration of well bore productivity for the native condition is determined based on a predicted sand stability failure under the native condition, and the duration of well bore productivity for the stabilization-treated condition is determined based on a predicted sand stability failure under the stabilization-treated condition.

9. The method of claim 7, wherein the resource production rate for the native condition is determined based on a nodal analysis flow simulation for the native condition, and the resource production rate for the stabilization-treated condition is determined based on a nodal analysis flow simulation for the stabilization-treated condition.

10. The method of claim 9, wherein the nodal analysis flow simulation for the native condition accounts for variations in reservoir pressure over time under the native condition, and the nodal analysis flow simulation for the stabilization-treated condition accounts for variations in reservoir pressure over time under the stabilization-treated condition.

11. The method of claim 1, wherein the first predicted resource production output is based on a sand stability model analysis for the native condition of the subterranean reservoir with a mechanical sand control scheme.

12. The method of claim 11, wherein the mechanical sand control scheme includes at least one of a gravel pack, a fracture pack, or sand screens.

13. A non-transitory computer-readable medium storing instructions that, when executed by data processing apparatus, perform operations comprising:
   determining a first predicted resource production output for a subterranean reservoir based on a sand stability model analysis for a native condition of the subterranean reservoir;
   determining a second predicted resource production output for the subterranean reservoir based on a sand stability model analysis for a stabilization-treated condition of the subterranean reservoir; and
   outputting an economic value comparison of resource production for the native condition and resource production for the stabilization-treated condition based on the first predicted resource production output and the second predicted resource production output.

14. The computer-readable medium of claim 13, wherein the economic value comparison includes information on a net present value of resource production for the native condition and information on a net present value of resource production for the stabilization-treated condition.

15. The computer-readable medium of claim 14, the operations comprising analyzing:
   calculating the net present value of resource production for the native condition based on a cost of completion under the native condition and a time value of resource production under the native condition; and
   calculating the net present value of resource production for the stabilization-treated condition based on a cost of completion under the stabilization-treated condition and a time value of resource production under the stabilization-treated condition.

16. The computer-readable medium of claim 13, the operations comprising analyzing sensitivity of the economic value comparison to variations in input parameters used to determine the first predicted resource production output and the second predicted resource production output.

17. The computer-readable medium of claim 13, the operations comprising selecting a resource production plan for the subterranean reservoir based on the economic value comparison, wherein the selected resource production plan includes production of reservoir resources under the native condition or production of reservoir resources under the stabilization-treated condition.

18. The computer-readable medium of claim 13, wherein determining the first predicted resource production output comprises:
   determining a duration of wellbore productivity for the native condition based on the sand stability model analysis for the native condition; and
   determining a resource production rate for the native condition over the duration of wellbore productivity for the native condition; and
   determining the second predicted resource production output includes:
   determining a duration of wellbore productivity for the stabilization-treated condition based on the sand stability model analysis for the stabilization-treated condition; and
   determining a resource production rate for the stabilization-treated condition over the duration of wellbore productivity for the stabilization-treated condition.

19. The computer-readable medium of claim 18, wherein the duration of well bore productivity for the native condition is determined based on a predicted sand stability failure under the native condition, and the duration of well bore productivity for the stabilization-treated condition is determined based on a predicted sand stability failure under the stabilization-treated condition.

20. The computer-readable medium of claim 18, wherein the resource production rate for the native condition is determined based on a nodal analysis flow simulation for the native condition, and the resource production rate for the stabilization-treated condition is determined based on a nodal analysis flow simulation for the stabilization-treated condition.

21. A computing system comprising:
   a sand stability module operable to:
      model sand stability for a native condition of a subterranean reservoir; and
      model sand stability for a stabilization-treated condition of the subterranean reservoir; and
   a resource prediction module operable to:
      determine a first predicted resource production output for the subterranean reservoir based on the sand stability model for the native condition; and
      determine a second predicted resource production output for the subterranean reservoir based on the sand stability model for the stabilization-treated condition;
   an economics module operable to generate an economic value comparison of resource production for the native condition and the stabilization-treated condition based on the first predicted resource production output and the second predicted resource production output.

22. The system of claim 21, wherein the resource prediction module is operable to determine wellbore duration and resource production rate based on a sand stability model.

23. The system of claim 21, wherein the economics module is operable to determine wellbore completion costs and net present value of resources.

24. The system of claim 21, wherein the sand stability module is operable to predict sand stability failure for the native condition under a mechanical sand control scheme that includes at least one of a gravel pack, a fracture pack, or sand screens.

25. The system of claim 21, wherein the sand stability module is operable to predict sand stability failure for the stabilization-treated condition based on a modeled sand consolidation treatment for the subterranean reservoir.

* * * * *